US 6,616,853 B1

(12) United States Patent
Staple et al.

(10) Patent No.: US 6,616,853 B1
(45) Date of Patent: Sep. 9, 2003

(54) METHOD FOR REDUCING LEACHING IN METAL-COATED MEMS

(75) Inventors: Bevan Staple, Longmont, CO (US); David Miller, Louisville, CO (US); Lilac Muller, Boulder, CO (US)

(73) Assignee: Network Photonics, Inc., Boulder, CO (US)

(*) Notice: Subject to any disclaimer, the term of this patent is extended or adjusted under 35 U.S.C. 154(b) by 0 days.

(21) Appl. No.: 09/799,916

(22) Filed: Mar. 5, 2001

(51) Int. Cl.$^7$ ............................. H01L 21/00; B44C 1/22
(52) U.S. Cl. ............................. 216/2; 216/99; 438/745; 438/753
(58) Field of Search ............... 216/2, 99; 438/745, 438/756, 753; 205/640, 660, 668

(56) References Cited

PUBLICATIONS

Ashruf, C.M.A. et al. "Galvanic porous silicon formation without external contacts", Sensors and Actuators 74, Jun. 1999, pp. 118–122.

Torcheux, L. et al. "Electrochemical Coupling Effects on the Corrosion of Silicon Samples in HF Solutions," J. Electrochem. Soc., vol. 142, No. 6, Jun. 1995, pp. 2037–2046.

Keller, Christopher Guild, "Microfabricated Silicon High Aspect Ratio Flexures for In–Plane Motion," dissertation submitted in the graduated division of the University of California, Berkeley, Fall 1998.

Muller, Lilac, "Gimballed Electrostatic Microactuators with Embedded Interconnects," dissertation submitted in the graduate division of the University of California, Berkeley, Springs 2000.

Ark–Chew Wong, John R. Clark and Clark T.–C. Nguyen, *Annual–Activated, Tunable, 68 MHz Micromechanical Filters*, Center for Integrated Microsystems, Dept. of Electrical Engineering and Computer Science, University of Michigan, Ann Arbor, Michigan 48109, Transducers '99, Jun. 7–10, 1999, pp. 1390–1393, Sendai, Japan.

*Primary Examiner*—William A. Powell
(74) *Attorney, Agent, or Firm*—Townsend and Townsend and Crew LLP

(57) ABSTRACT

A method is provided for preventing dopant leaching from a doped structural film during fabrication of a microelectromechanical system. A microstructure that includes the doped structural film, sacrificial material, and metallic material is produced with a combination of deposition, patterning, and etching techniques. The sacrificial material is dissolved with a release solution that has a substance destructive to the sacrificial material. This substance also acts as an electrolyte, forming a galvanic cell with the doped structural film and metallic material acting as electrodes. The effects of the galvanic cell are suppressed by including a nonionic detergent mixed in the release solution.

34 Claims, 9 Drawing Sheets

*Fig. 4A*
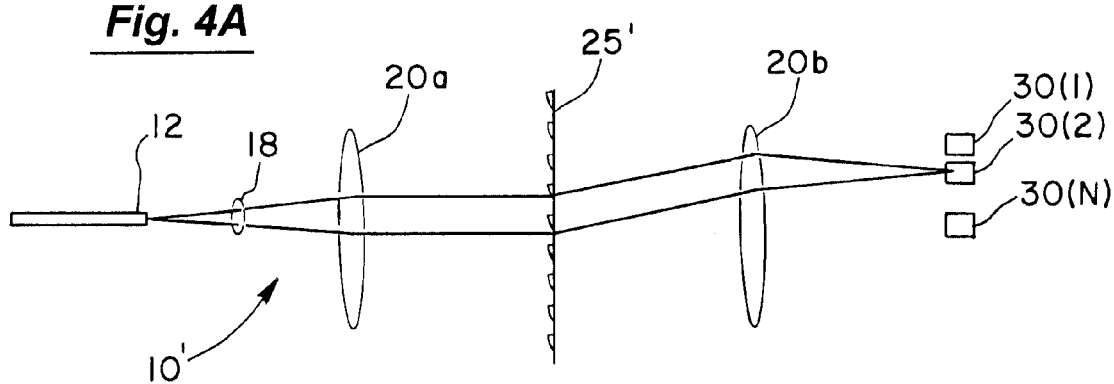
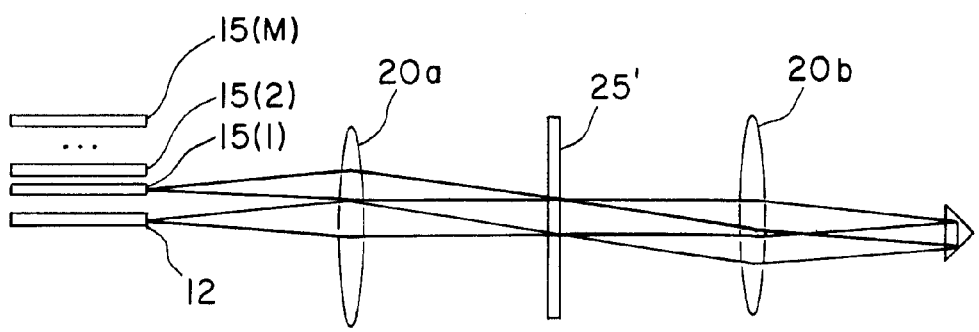
*Fig. 4B*
*Fig. 5*
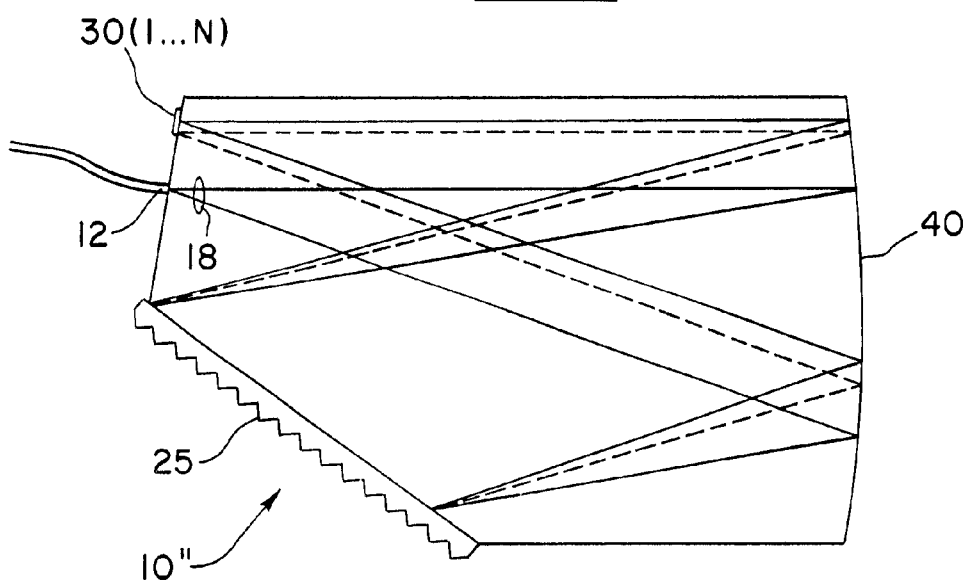

METHOD FOR REDUCING LEACHING IN METAL-COATED MEMS

BACKGROUND OF THE INVENTION

This application relates generally to microelectromechanical systems and more specifically to the reduction of leaching during the fabrication of microelectromechanical systems.

In recent years, increasing emphasis has been made on the development of techniques for producing microscopic systems that may be tailored to have specifically desired electrical and/or mechanical properties. Such systems are generically described as microelectromechanical systems (MEMS) and are desirable because they may be constructed with considerable versatility despite their very small size. The micromachining fabrication processes that are used in MEMS fabrication may be categorized generically into three classes: deposition, patterning, and etching. The fabrication of any specific MEMS structure will generally use some combination of these three basic techniques in some order.

Deposition refers generally to a class of techniques in which a layer of material is formed on the surface of a structural film or other material layer. Techniques used for such deposition include epitaxy, oxidation, sputtering, evaporation, various forms of chemical-vapor deposition, spin-on methods, sol-gel methods, anodic bonding, electroplating, and fusion bonding. Such deposition techniques generally produce an approximately uniform layer over the entire underlying surface. Both structural and sacrificial layers may be deposited, "structural layers" referring to those intended to form part of the final MEMS device and "sacrificial layers" referring to those meant to be dissolved later on in the process of forming the final MEMS device Patterning refers generally to a class of procedures that are used in preparation for removing specific portions of a uniformly deposited layer or of a structural film. Typically, a layer of photosensitive polymer ("photoresist") is deposited using some deposition technique. The photoresist is patterned by optical exposure through a mask to print an image of the mask onto the photoresist, with the exposed photoresist being subsequently dissolved by immersion in an aqueous developer solution. Optical exposure through the mask may take place in at least three modes: contact, in which the mask touches the photoresist; proximity, in which the mask is merely brought close to the photoresist; or projection, in which an optical arrangement is used to project an image of the mask onto the photoresist.

The remaining photoresist after patterning protects the microstructure from exposure during etching, in which structural film material or portions of deposited material (as defined by the patterned photoresist) are selectively removed. Such removal may proceed by a variety of methods, including wet isotropic etching, wet anisotropic etching, plasma etching, reactive-ion etching (RIE), and deep reactive-ion etching (DRIE).

The removal of sacrificial layers is referred to as a "release," and typically involves a chemical reaction. In surface micromachining, the sacrificial layer is generally silicon dioxide and the release involves the use of hydrofluoric acid (HF). Long exposure to HF can result in damage to the structural layers. For example, it has been reported that HF may attack the grain boundaries of polycrystalline silicon ("polysilicon"), making this structural material mechanically weaker. In addition, exposure to HF may cause dopants, which may be important for the electronic properties of the microstructure, to leach from the structural layers. In order to avoid such leaching, it is common to seek micromachining methods that limit the exposure of HF to the structural layers. Such techniques may require additional fabrication steps to minimize the extent of the exposure to structural layers or may require limiting the time of exposure to the microstructure. This may increase the complexity of the fabrication process and/or limit the exposure time to sacrificial layers to less than would otherwise be desirable.

SUMMARY OF THE INVENTION

The invention thus provides a method for preventing dopant leaching from a doped structural film during fabrication of a microelectromechanical system. A microstructure that includes the doped structural film, sacrificial material, and metallic material is produced with a combination of deposition, patterning, and etching techniques. The sacrificial material is dissolved with a release solution that has a substance destructive to the sacrificial material. This substance also acts as an electrolyte, forming a galvanic cell with the doped structural film and metallic material acting as electrodes. The effects of the galvanic cell are suppressed by including a nonionic detergent mixed in the release solution.

The release solution may comprise an acid, such as HF. The doped structural film may comprise a doped semiconductor, such as doped silicon or doped polysilicon. The sacrificial material may comprise an oxide, such as a silicon oxide or alumina, may comprise a nitride, such as a silicon nitride, or may comprise photoresist. The metallic material may be gold, aluminum, copper, platinum, or nickel, among others. The nonionic detergent may comprise an alkyl group and a polyether-linked hydroxy group commonly linked to an aryl group. In one embodiment, the nonionic detergent comprises a Triton X™ detergent, such as Triton X-100.™ The nonionic detergent may alternatively comprise a hydrophilic moiety and a hydrophobic moiety commonly linked to an aryl group.

In certain embodiments, the microelectromechanical system comprises part of a mirror array or routing mechanism that may be used in a wavelength router.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and is enclosed in parentheses to denote one of multiple similar components. When reference is made to a reference numeral without specification to an existing sublabel, it is intended to refer to all such multiple similar components.

FIGS. 4A and 4B are schematic top and side views, respectively, of a second embodiment of a wavelength router that uses spherical focusing elements; and FIG. 5 is a schematic top view of a third embodiment of a wavelength router that uses spherical focusing elements;

DESCRIPTION OF THE SPECIFIC EMBODIMENTS

1. Introduction

Figure 1A:
FIGS. 1A and 1B are microphotographs illustrating surface roughness and sporadic dopant leaching that can be seen visually.
Figure 1B:
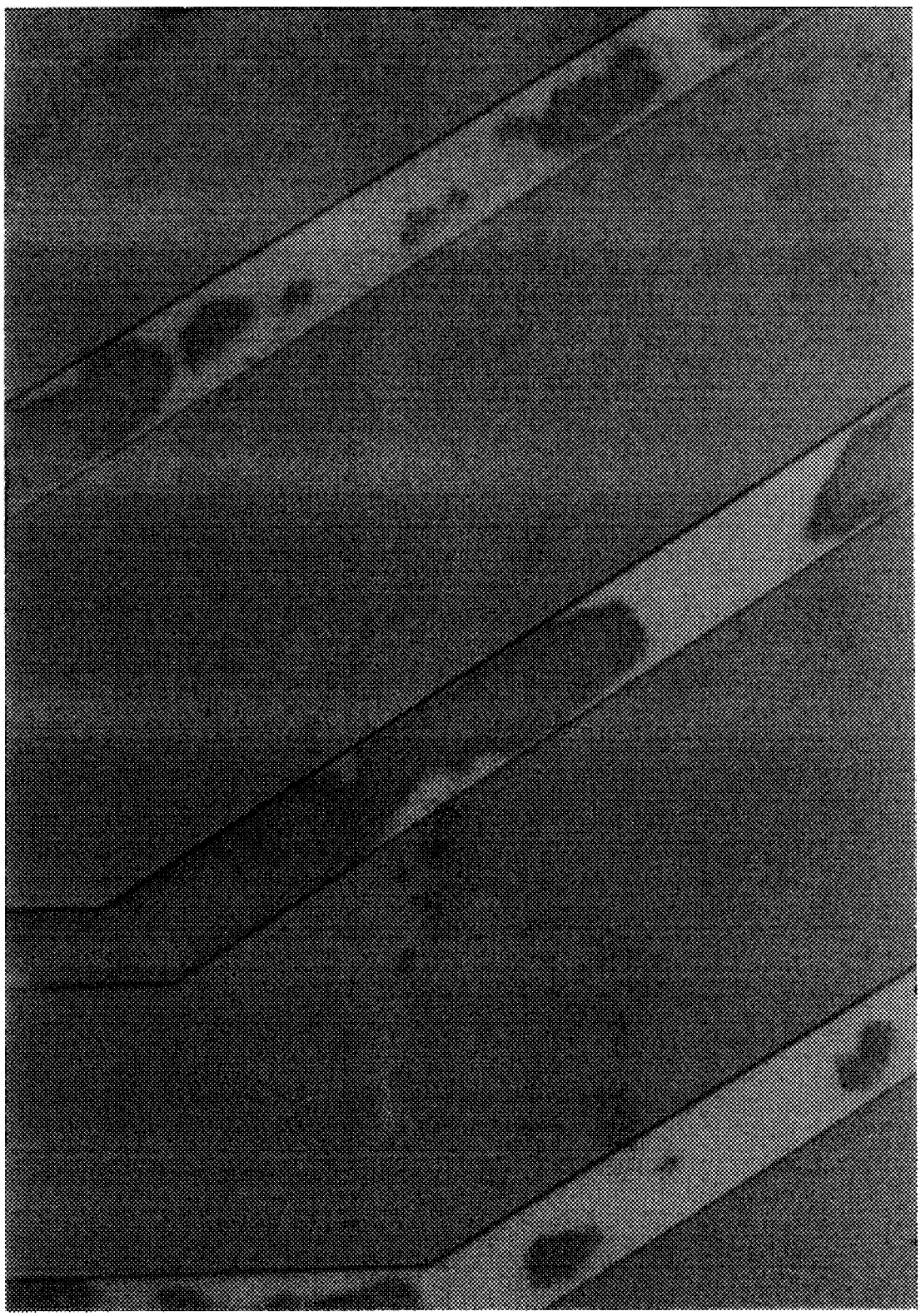

FIGS. 1A and 1B are micrographs that illustrate the effect of dopant leaching. When dopants leach from a polysilicon structural film, they cause surface roughness that can be detected visually under a microscope. The microphotographs shown in FIG. 1A show that when HF is used during a standard release, there is significant surface roughness on the polysilicon structural film that result from dopant leaching. FIG. 1B similarly shows sporadic spotting on electrodes that may be formed on the polysilicon structural film, also resulting from dopant leaching. The mechanism by which leaching of dopants occurs during a release step may be understood by considering the galvanic character of the system provided by the immersion of the microstructure in the acidic aqueous solution. For example, when a microstructure that comprises a layer of doped polysilicon and a layer of metal, such as gold, is exposed to an acid, such as HF, the acid acts as an electrolyte. In effect, the system behaves as a galvanic cell in which the doped polysilicon and the metal act as two electrodes. The resulting galvanism leaches dopants from the polysilicon layer.

Figure 2:
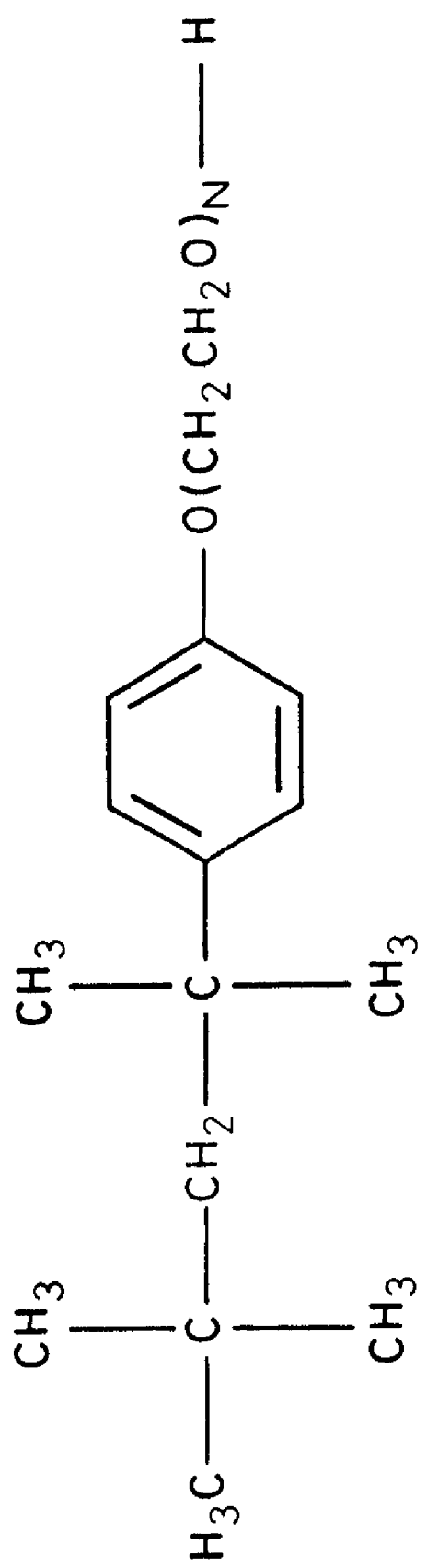
FIG. 2 is a diagram showing the chemical structure of certain nonionic detergents used with embodiments of the present invention.

The inventors have made the unexpected discovery that this galvanism may be substantially reduced by including a small amount of certain nonionic detergents with the acid in the aqueous solution. In a particular embodiment, a compound with an alkyl group and a polyether-linked hydroxy group commonly linked to an aryl group is used. Such compound may be functionally characterized by the fact that a hydrophilic moiety and a hydrophobic moiety are commonly linked to an aryl group. One such compound is marketed under the trade name Triton X-100™ and has the structure shown in FIG. 2. The discovery was unexpected because such nonionic detergents are used primarily in biochemical applications to solubilize proteins; the discovered effect on galvanic properties during release in the fabrication of MEMS structures was not indicated or suggested by any uses of such compounds known to the inventors.

The "X" series of Triton detergents are produced from octylphenol polymerized with ethylene oxide. The number "100" in the trade name is indirectly related to the number of ethylene oxide units in the structure. Triton X-100™ has an average of N=9.5 ethylene oxide units per molecule, with an average molecular weight of 625. In commercially available products, lower and higher mole adducts may also be present in lesser amounts, varying within a given supplier's standard manufacturing conditions. A by-product formed during the reaction is polyethylene glycol, a homopolymer of ethylene oxide. Acid is also typically added to the product to neutralize the product after the base catalyzed reaction is completed. Some commercial preparations are known to contain peroxides up to 0.22% hydrogen peroxide ($H_2O_2$) equivalents. Examples of compounds that have a similar structure to Triton X-100™ include Igepal CA-630™ and Nonidet P-40™.

2. Wavelength Router

The discovery of the effect of such nonionic detergents was made by the inventors in the course of investigating the fabrication of MEMS structures for use in a wavelength router, such as the one described in detail in the copending, commonly assigned United States Patent Application, filed Nov. 16, 1999 and assigned Ser. No. 09/442,061, entitled "Wavelength Router," which is herein incorporated by reference in its entirety, including the Appendix, for all purposes. The following description of the structure of some embodiments of such a wavelength router facilitates understanding the subsequently presented data illustrating the effect of the nonionic detergents during release.

Fiber optic telecommunications systems are currently deploying a relatively new technology called dense wavelength division multiplexing (DWDM) to expand the capacity of new and existing optical fiber systems to help satisfy the steadily increasing global demand for communication bandwidth. In DWDM, multiple wavelengths of light simultaneously transport information through a single optical fiber. Each wavelength operates as an individual channel carrying a stream of data. The carrying capacity of a fiber is multiplied by the number of DWDM channels used.

In all telecommunication networks, there is the need to connect individual channels (or circuits) to individual destination points, such as an end customer or to another network. Systems that perform these functions are called cross-connects. Additionally, there is the need to add or drop particular channels at an intermediate point. Systems that perform these functions are called add-drop multiplexers (ADMs). All of these networking functions are performed with a wavelength router used with the current invention by an all-optical network. Optical networks designed to operate at the wavelength level are commonly called "wavelength routing networks" or "optical transport networks" (OTN). In a wavelength routing network, the individual wavelengths in a DWDM fiber must be manageable. New types of photonic network elements operating at the wavelength level are required to perform the cross-connect, ADM and other network switching functions. Two of the primary functions are optical add-drop multiplexers (OADM) and wavelength-selective cross-connects (WSXC).

Wavelength routing functions may be performed optically with a free-space optical train disposed between the input ports and the output ports, and a routing mechanism. The free-space optical train can include air-spaced elements or can be of generally monolithic construction. The optical train includes a dispersive element such as a diffraction grating, and is configured so that the light from the input port encounters the dispersive element twice before reaching any of the output ports. The routing mechanism includes one or more routing elements and cooperates with the other elements in the optical train to provide optical paths that couple desired subsets of the spectral bands to desired output ports. The routing elements are disposed to intercept the different spectral bands after they have been spatially separated by their first encounter with the dispersive element.

Figure 3A:
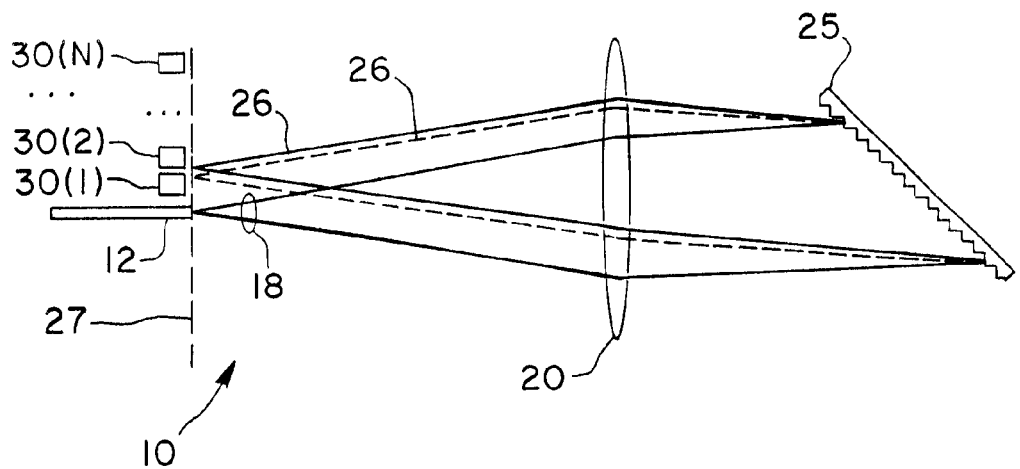
FIGS. 3A, 3B, and 3C are schematic top, side, and end views, respectively, of one embodiment of a wavelength router that uses spherical focusing elements.
Figure 3B:
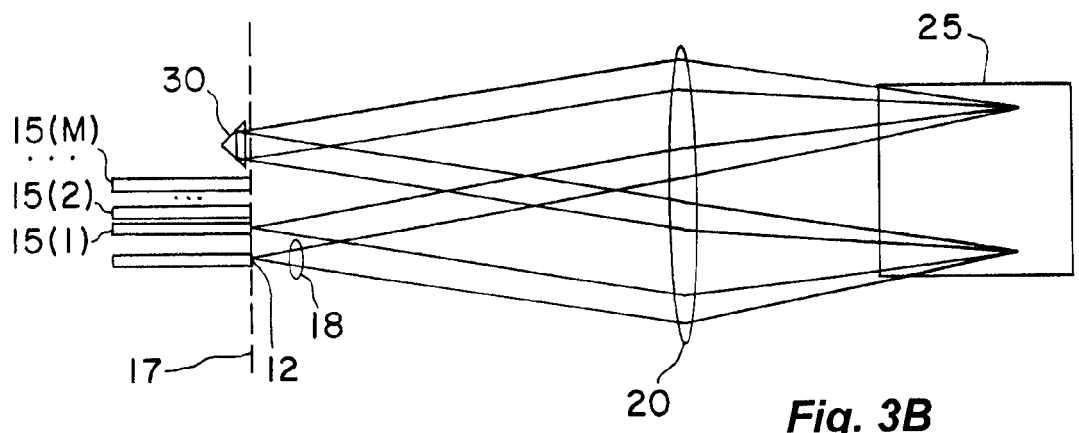
Figure 3C:
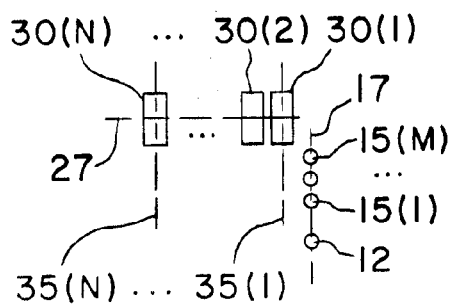

FIGS. 3A, 3B, and 3C are schematic top, side, and end views, respectively, of one embodiment of a wavelength router 10. Its general functionality is to accept light having a plurality N of spectral bands at an input port 12, and to direct subsets of the spectral bands to desired ones of a plurality M of output ports, designated 15(1) . . . 15(M). The output ports are shown in the end view of FIG. 3C as disposed along a line 17 that extends generally perpendicular to the top view of FIG. 3A. Light entering the wavelength router 10 from input port 12 forms a diverging beam 18, which includes the different spectral bands. Beam 18 encounters a lens 20 that collimates the light and directs it to a reflective diffraction grating 25. The grating 25 disperses the light so that collimated beams at different wavelengths are directed at different angles back towards the lens 20.

Two such beams are shown explicitly and denoted 26 and 26', the latter drawn in dashed lines. Since these collimated beams encounter the lens 20 at different angles, they are focused towards different points along a line 27 in a transverse plane extending in the plane of the top view of FIG. 3A. The focused beams encounter respective ones of a plurality of retroreflectors, designated 30(1) . . . 30(N), located near the transverse plane. The beams are directed back, as diverging beams, to the lens 20 where they are collimated, and directed again to the grating 25. On the second encounter with the grating 25, the angular separation between the different beams is removed and they are directed back to the lens 20, which focuses them. The retroreflectors 30 may be configured to send their intercepted beams along a reverse path displaced along respective lines 35(1) . . . 35(N) that extend generally parallel to line 17 in the plane of the side view of FIG. 3B and the end view of FIG. 3C, thereby directing each beam to one or another of output ports 15.

Another embodiment of a wavelength router, designated 10', is illustrated with schematic top and side views in FIGS. 4A and 4B, respectively. This embodiment may be considered an unfolded version of the embodiment of FIGS. 3A–3C. Light entering the wavelength router 10' from input port 12 forms diverging beam 18, which includes the different spectral bands. Beam 18 encounters a first lens 20a, which collimates the light and directs it to a transmissive grating 25'. The grating 25' disperses the light so that collimated beams at different wavelengths encounter a second lens 20b, which focuses the beams. The focused beams are reflected by respective ones of plurality of retroreflectors 30 as diverging beams, back to lens 20b, which collimates them and directs them to grating 25'. On the second encounter, the grating 25' removes the angular separation between the different beams, which are then focused in the plane of output ports 15 by lens 20a.

A third embodiment of a wavelength router, designated 10", is illustrated with the schematic top view shown in FIG. 5. This embodiment is a further folded version of the embodiment of FIGS. 3A–3C, shown as a solid glass embodiment that uses a concave reflector 40 in place of lens 20 of FIGS. 3A–3C or lenses 20a and 20b of FIGS. 4A–4B. Light entering the wavelength router 10" from input port 12 forms diverging beam 18, which includes the different spectral bands. Beam 18 encounters concave reflector 40, which collimates the light and directs it to reflective diffraction grating 25, where it is dispersed so that collimated beams at different wavelengths are directed at different angles back towards concave reflector 40. Two such beams are shown explicitly, one in solid lines and one in dashed lines. The beams then encounter retroreflectors 30 and proceed on a return path, encountering concave reflector 40, reflective grating 25', and concave reflector 40, the final encounter with which focuses the beams to the desired output ports.

3. Retroreflector Implementations

Figure 6A:
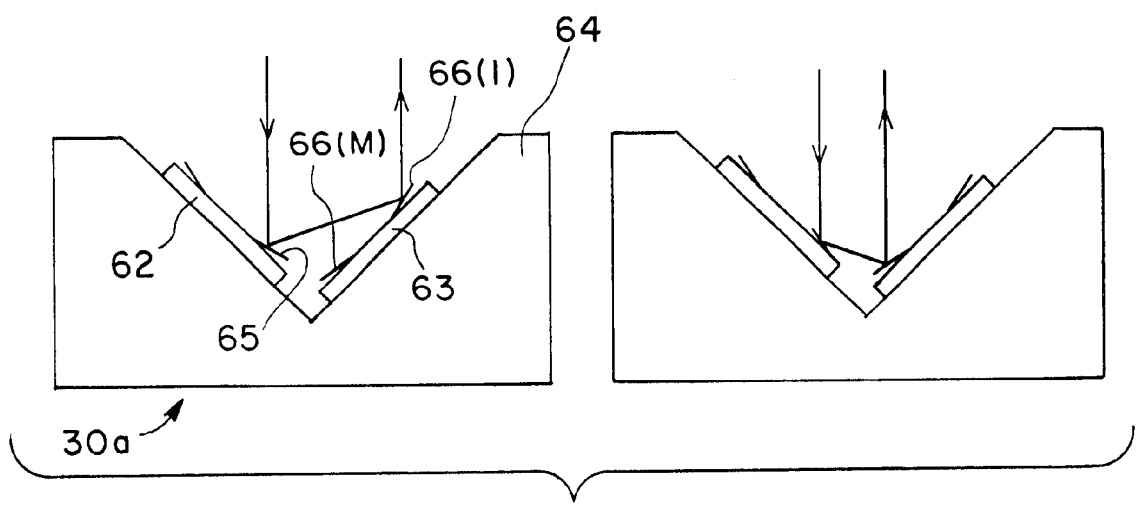
FIGS. 6A and 6B are side and top views of an implementation of a micromirror retroreflector array.
Figure 6B:
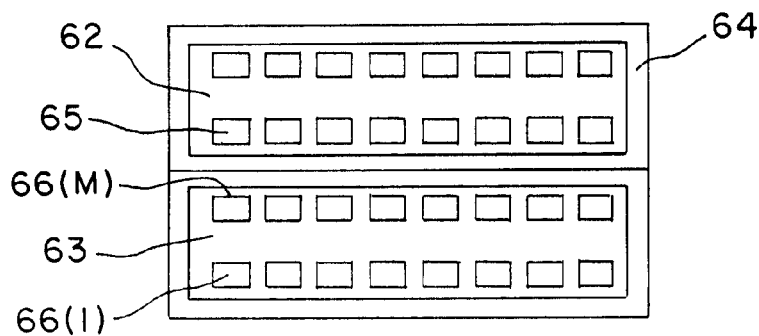
Figure 6C:
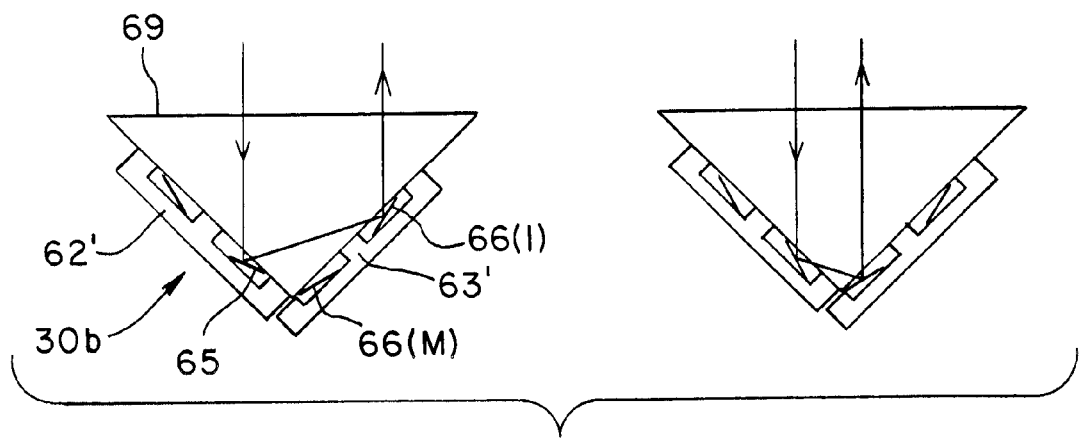
FIG. 6C is an alternative implementation of a micromirror retroreflector array.

FIG. 6A shows schematically the operation of a retroreflector, designated 30a, that uses micromirrors. FIG. 6B is a top view. A pair of micromirror arrays 62 and 63 is mounted to the sloped faces of a V-block 64. A single micromirror 65 in micromirror array 62 and a row of micromirrors 66(1 . . . W) in micromirror array 63 define a single retroreflector. Micromirror arrays may conveniently be referred to as the input and output micromirror arrays, with the understanding that light paths are reversible. The left portion of the figure shows micromirror 65 in a first orientation so as to direct the incoming beam to micromirror 66(1), which is oriented 90° with respect to micromirror 65's first orientation to direct the beam back in a direction opposite to the incident direction. The right half of the figure shows micromirror 65 in a second orientation so as to direct the incident beam to micromirror 66(M). Thus, micromirror 65 is moved to select the output position of the beam, while micromirrors 66(1 . . . M) are fixed during normal operation. Micromirror 65 and the row of micromirrors 66 (1 . . . M) can be replicated and displaced in a direction perpendicular to the plane of the figure. While micromirror array 62 need only be one-dimensional, it may be convenient to provide additional micromirrors to provide additional flexibility.

In one embodiment, the micromirror arrays are planar and the V-groove has a dihedral angle of approximately 90° so that the two micromirror arrays face each other at 90°. This angle may be varied for a variety of purposes by a considerable amount, but an angle of 90° facilitates routing the incident beam with relatively small angular displacements of the micromirrors. The micromirror arrays may be formed as structures micromachined on the surface of a silicon chip. These mirrors are attached to pivot structures also micromachined on the surface of the chip. In some implementations, the micromirrors are selectably tilted about a suitably oriented axis using electrostatic attraction.

In certain embodiments, the input micromirror array has at least as many rows of micromirrors as there are input ports (if there are more than one), and as many columns of mirrors as there are wavelengths that are to be selectably directed toward the output micromirror array. Similarly, in some embodiments, the output micromirror array has at least as many rows of micromirrors as there are output ports, and as many columns of mirrors as there are wavelengths that are to be selectably directed to the output ports.

In a system with a magnification factor of one-to-one, the rows of micromirrors in the input array are parallel to each other and the component of the spacing from each other along an axis transverse to the incident beam corresponds to the spacing of the input ports. Similarly, the rows of micromirrors in the output array are parallel to each other and spaced from each other (transversely) by a spacing corresponding to that between the output ports. In a system with a different magnification, the spacing between the rows of mirrors would be adjusted accordingly.

Figure 8A:
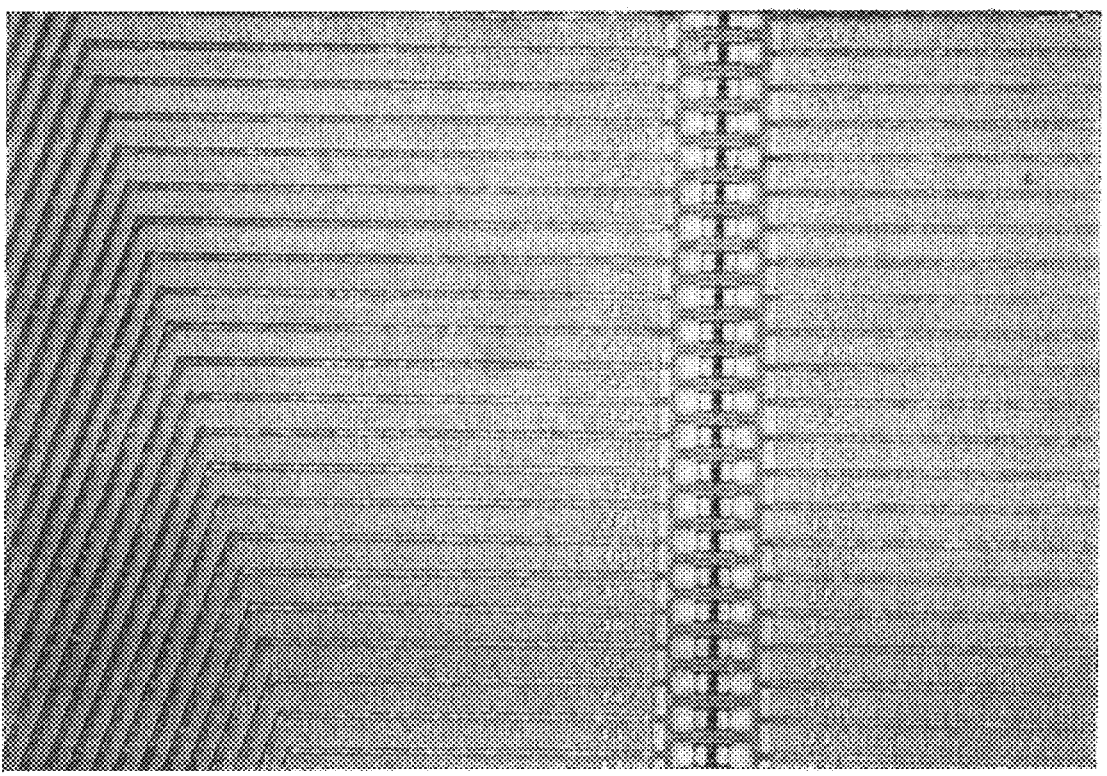
FIGS. 8A, 8B, and 8C are microphotographs of electrodes for mirror arrays produced according to an embodiment of the invention.
Figure 8B:
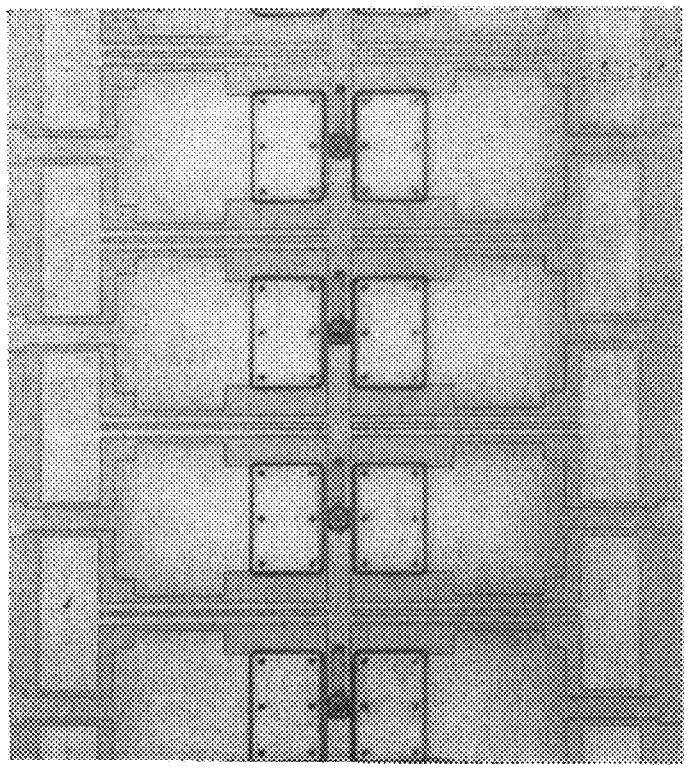
Figure 8C:
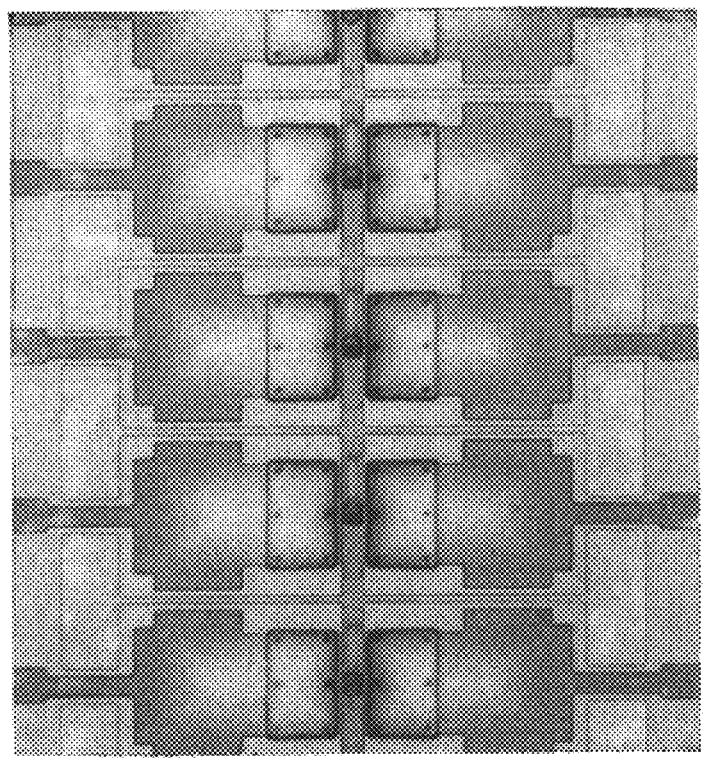

FIGS. 8A–8C are micrographs showing an example of electrodes for such a router. The electrodes are fabricated using MEIMS techniques of deposition, patterning, and etching of sacrificial and structural materials, and includes left/right pairs. In one embodiment, the structural film layers are made of polysilicon and the mirrors, when deposited, are coated with gold, although alternative materials may also be used. The polysilicon and gold thus create a galvanic cell when HF is available to act as an electrolyte. A polysilicon mirror common line is included as are traces corresponding to each of the mirror sides, i.e. left or right. The traces may also be coated with gold. During the fabrication process, sacrificial layers are deposited and etched, the sacrificial layers being composed of silicon dioxide, although alternative materials such as silicon nitrides may also be used.

4. Experimental Results
a. Release Procedure

Figure 7:
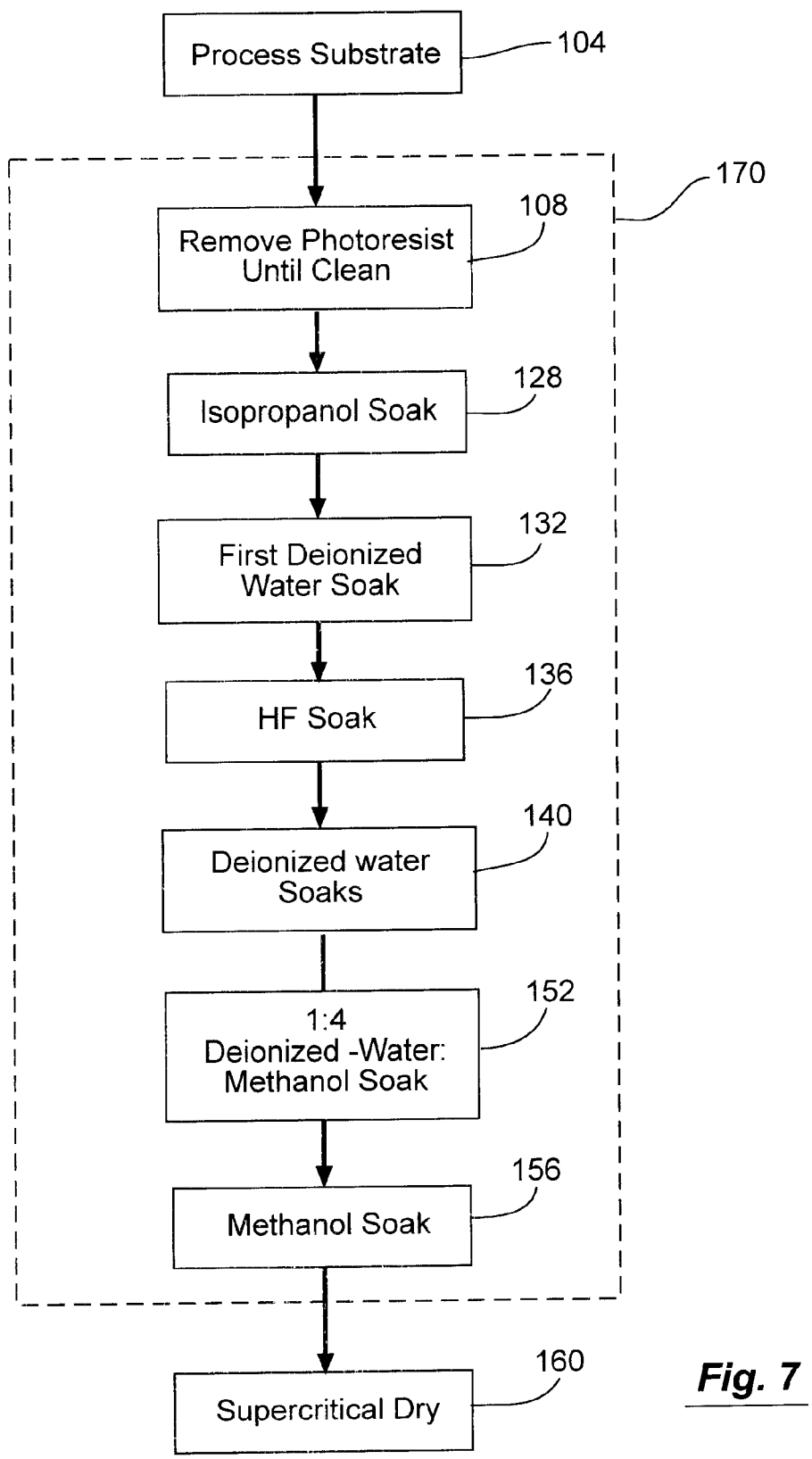
FIG. 7 is a flowchart illustrating steps used in one implementation of a release process.

The sacrificial layers are dissolved during the release step after all processing, including metallization, has been completed. Several experiments were performed using the mirror arrays described above to verify the effect of including a nonionic detergent in the release step. One implementation of a general release process is illustrated as a flowchart in FIG. 7. The release procedure itself is denoted generally by reference numeral 170 and may be part of a more extensive micromachining MEMS process. Such a more extensive process may include a step for processing the structural film (step 104) and a step for drying the structure after release (step 160).

The release procedure begins by removing protective photoresist (step 108) using a procedure until it is clean, such as acetone soaking. The clean die is then soaked in the isopropanol at step 128 for at least one minute. It is then soaked in deionized water at step 132 for at least one minute. Subsequently, the die is soaked in HF at step 136 where the sacrificial material is dissolved; exposure time to HF may optimized to a particular release. The HF residue may be removed at step 140 with one or more baths in clean deionized water. The die is then soaked at step 152 in the 1:4 mixture of deionized water to methanol for at least five minutes. Finally, the die is soaked in concentrated methanol at step 156 for at least ten minutes.

According to the invention, a small quantity of a nonionic detergent such as Triton X-100™ is added with the HF soak at step 136. In one embodiment, by volume, the relative concentration of the Triton X-100™ to HF is approximately 0.1 vol. %. The various experimental results described below illustrate the effect of this addition. The results are quantified by measuring the resistance of traces on the die for various mirrors after the die has been released. In particular, the resistance was measured along traces of different lengths. The resistance is a useful measure of the degree of leaching because of the properties of the galvanic arrangement: the resistance of each trace increases as dopants leach from the polysilicon. Thus, the absolute values of the resistance measurements (which may depend individually on the length of leads) are not as important as their relative values when different hydrofluoric-acid compositions and different soaking times in those compositions are compared. For each measurement, the probe was scraped across the majority of the pad to obtain a valid, stable measurement. The significant digits in the results tabulated below represent the stability of the reading. In certain cases, the resistance is greater than the 10-MΩ capacity of the ohmmeter used, such results being identified with resistance measurements of "OL" (for "overload").

b. Leaching of Dopants During Release

Two experiments illustrate the effect of the galvanic cell on leaching of dopants during release when HF is used at step 136 without any nonionic detergent. In the first experiment, resistance measurements for four traces having a different number of squares were taken at different HF exposure times for mirror arrangements having no gold and arrangements in which the mirrors, traces, and probe pads were coated with gold. For each of the measured results, the number of squares for the trace is reported, showing the trend that resistance increases with the length of the trace. The number of squares defines the area of the trace according to its length and width. The results are tabulated in Table I.

TABLE I

| | Number of | Resistance (kΩ) | | | | | |
|---|---|---|---|---|---|---|---|
| | | No gold | | | Gold on mirrors and pads | | |
| Measurement | Squares | 30 sec | 15 min | 20 min | 30 sec | 15 min | 20 min |
| $R_1$ | 30 | 1.0 | 1.1 | 1.0 | 0.9 | OL | OL |
| $R_2$ | 35 | 1.2 | 1.1 | 1.1 | 1.0 | OL | OL |
| $R_3$ | 58 | 1.8 | 1.7 | 1.6 | 1.5 | 2.5 | 2.5 |
| $R_4$ | 1375 | 42.3 | 42.5 | 42.7 | 42.1 | OL | OL |

As can be seen from the results, when there is no gold present, the resistance for all four measurements remains approximately independent of the HF soaking time. When gold is present on the mirrors and pads, however, the creation of a galvanic cell when the die is exposed to HF results in a sharp increase in the resistance for all but the third measurement $R_3$, which is a measurement at two points on the top common line. The increase in resistance is thus attributable to dopant leaching from the polysilicon structural film as a result of forming the galvanic cell.

In a related second experiment, similar measurements were made for a larger number of traces and for a greater number of HF soaking times when the mirrors and pads were coated with gold. The results in Table II present resistance measurements for six different traces, three having 30 squares and three having 35 squares.

TABLE II

| | No. of | Resistance (kΩ) | | | | | |
|---|---|---|---|---|---|---|---|
| Measurement | Squares | Pre-HF | 1 min | 5 min | 10 min | 15 min | 25 min |
| $R_5$ | 30 | 0.9 | 0.9 | 0.9 | 1.1 | 1.2 | 2.2 |
| $R_6$ | 30 | 0.9 | 1.0 | 0.9 | 1.0 | 1.4 | 32.4 |
| $R_7$ | 30 | 0.9 | 1.0 | 1.0 | 1.2 | 1.8 | OL |

TABLE II-continued

| Measurement | No. of Squares | Resistance (kΩ) | | | | | |
|---|---|---|---|---|---|---|---|
| | | Pre-HF | 1 min | 5 min | 10 min | 15 min | 25 min |
| $R_8$ | 35 | 1.1 | 1.2 | 1.1 | 1.2 | 1.4 | 2.9 |
| $R_9$ | 35 | 1.1 | 1.1 | 1.1 | 1.2 | 1.6 | OL |
| $R_{10}$ | 35 | 1.0 | 1.2 | 1.1 | 1.4 | 2.2 | OL |

Using the published sheet resistance for polysilicon of 30 $\Omega/\square$ to interpret these results, the tabulated resistance values may be compared with 0.9 kΩ for the first three traces and with 1.1 kΩ for the last three traces. The data show that exposure to HF increases the resistance of the interconnect lines, with longer exposure having a greater effect, indicating that HF causes dopant leaching. This effect is nonlinear.

c. Suppression of Leaching During Release

In a further experiment, the suppression of leaching effects was specifically quantified by measuring resistances for release chemistries that do and do not include Triton X-100™ in the HF soak. The resistance was measured between the probe pad and electrode immediately below the removed mirror. One set of results was obtained for "pure" 48% HF and a second set of results was obtained for 48% HF mixed with three drops of Triton X-100™. In addition, the effect of gold coverage was investigated. The results are tabulated in Table III for HF soaking times of 25 minutes.

number of squares corresponding to that interconnect path. The mean and standard deviation of those results for the different traces results in an average sheet resistance of 28.8±0.5 $\Omega/\square$. This value, after release, is virtually indistinguishable from the published polysilicon sheet resistance (without gold) of 29.4 $\Omega/\square$. Thus, even after a release procedure in which gold-coated surface micromachined MEMS were exposed to HF for 25 minutes, the presence of the nonionic detergent has acted substantially to prevent any significant dopant leaching.

5. Discussion

The experimental results presented above establish that certain nonionic detergents, when added to an acid during release of metal-coated surface micromachined MEMS, act to suppress the leaching almost entirely, regardless of the amount of metal coating the devices or the total exposure time to the acid. In particular, compounds with an alkyl

TABLE III

| Release Chemistry | Gold Coverage ($\mu m^2$) | Resistance (kΩ) | | | | | | |
|---|---|---|---|---|---|---|---|---|
| | | $R_{11}$ | $R_{12}$ | $R_{13}$ | $R_{14}$ | $R_{15}$ | $R_{16}$ | $R_{17}$ |
| 48% HF | 120 × 50 | 4.73 | OL | OL | OL | OL | OL | OL |
| 48% HF | 120 × 50 | 0.68 | OL | OL | OL | OL | OL | OL |
| 48% HF | 50 × 50 | 0.692 | 1530 | 63.4 | 15.02 | 14.86 | 18500 | OL |
| 48% HF | 50 × 50 | 0.781 | OL | OL | 690 | 17.71 | 97.9 | OL |
| 48% HF + X-100 | 120 × 50 | 0.702 | 5.72 | 8.09 | 10.7 | 11.56 | 13.24 | 39.5 |
| 48% HF + X-100 | 120 × 50 | 0.702 | 5.64 | 7.68 | 9.91 | 11.67 | 13.57 | 39.8 |
| 48% HF + X-100 | 50 × 50 | 0.696 | 5.25 | 7.08 | 9.09 | 11.47 | 12.73 | 39.9 |
| 48% HF + X-100 | 50 × 50 | 0.7 | 5.14 | 7.02 | 9.11 | 10.96 | 12.8 | 39.9 |
| For HF + Triton X-100 ™ Results: | | | | | | | | |
| Mean Resistance (kΩ) | | 0.70 | 5.44 | 7.47 | 9.70 | 11.42 | 13.09 | 39.78 |
| Standard Deviation (kΩ) | | 0.00 | 0.29 | 0.51 | 0.77 | 0.31 | 0.39 | 0.19 |
| Number of Squares | | 24.73 | 190.4 | 256.6 | 327.10 | 398.8 | 460.4 | 1373.4 |
| Sheet Resistance ($\Omega/\square$) | | 28.3 | 28.6 | 29.1 | 29.7 | 28.6 | 28.4 | 29.0 |
| Mean Sheet Resistance ± Std Dev ($\Omega/\square$) | | | | | 28.8 ± 0.5 | | | |

As is evident from the tabulated results, each combination of release chemistry and gold coverage was studied twice. From a visual inspection of the dies after release, a reduction in the gold coverage appears to lessen polysilicon attack. In such cases, not all of the traces are attacked. The resistance data in the top portion of the table support that conclusion and also present the following additional conclusions regarding the effect of Triton X-100™. When added to HF during release, it lessens the polysilicon attack significantly, reducing leaching. The mitigation of polysilicon attack by Triton X-100™ is orders of magnitude greater than the effect that results from reduction in the gold surface area.

The bottom portion of the table presents a calculation of the average sheet resistance after release using HF mixed with Triton X-100™. For each of the traces for which resistance measurements were made, the sheet resistance is calculated by dividing the average resistance of the four measurements using the mixed release chemistry by the group and a polyether-linked hydroxy group commonly linked to an aryl group, or compounds with a hydrophilic moiety and a hydrophobic moiety commonly linked to an aryl group act to suppress the leaching. Further, the mechanism to suppress leaching acts independent of the aspect ratio of structures, being equally useful for high-aspect-ratio ($\geq 20$) structures, low-aspect-ratio ($\leq 5$) structures, and structures with intermediate aspect ratios.

The arrangement that includes a polysilicon structural film, gold, and HF forms a galvanic cell, with the HF acting as the electrolyte and the polysilicon and gold each acting as electrodes. The inclusion of the nonionic detergents defined above in this arrangement acts to suppress the galvanic properties of this galvanic cell. This occurs either by suppressing the electrolytic behavior of the HF, without interfering with the etching properties of the HF, or by making one of the two electrodes inoperable. It is hypothesized that one or both of the electrodes is effectively deactivated by isolating it from the HF. In particular, the action of the nonionic detergent may act as a cover barrier on one of the electrodes, probably the gold electrode, thereby suppressing the galvanic properties of the arrangement. According to one hypothesized mechanism, the nonionic detergent causes the HF to be distributed over a larger area so that overall the leaching is mitigated. According to another hypothesized mechanism, the surfactant properties of the nonionic detergent increase the wetting of the polysilicon surface by making it more hydrophilic; as a result, the leaching is distributed more uniformly.

This galvanic mechanism indicates that various alternative materials may be substituted and still maintain the leaching-suppression effect of the invention. For example, a galvanic series of certain metals and alloys is arranged in order of corrosivity in Table V. Because the effect of the nonionic detergent is manifested by reducing the galvanic properties of the arrangement having a structural film, a metal, and a corrosive release solution, it is expected to have a more significant effect with those metals nearer the "Cathodic" end of the table rather than with those nearer the "Anodic" end of the table.

TABLE V

Anodic
Magnesium
Magnesium alloys
Zinc
Aluminum 25
Cadmium
Aluminum 17ST
Steel or Iron
Cast iron
Chromium-iron (active)
Ni-Resist
18-8 Chromium-nickel-iron (active)
18-8-3 Chromium-nickel-molybdenum-iron (active)
Lead-tin solders
Lead
Tin
Nickel (active)
Inconel (active)
Hastelloy C (active)
Brasses
Copper
Bronzes
Copper-nickel alloys
Monel
Silver solder
Nickel (passive)
Inconel (passive)
Chromium-iron (passive)
18-8 Chromium-nickel-iron passive
18-8-3 Chromium-nickel-molybdenum-iron (passive)
Hastelloy C (passive)
Silver
Carbon and graphite
Platinum
Gold
Cathodic Having described several embodiments, it will be recognized by those of skill in the art that various modifications, alternative constructions, and equivalents may be used without departing from the spirit of the invention. Accordingly, the above description should not be taken as limiting the scope of the invention, which is defined in the following claims.

What is claimed is:

1. A method for preventing dopant leaching from a doped structural film during fabrication of a microelectromechanical system, the method comprising:

producing a microstructure that includes the doped structural film, sacrificial material, and metallic material by a combination of techniques selected from the group consisting of deposition, patterning, and etching;

dissolving the sacrificial material with a release solution, the release solution comprising a substance destructive to the sacrificial material and acting as an electrolyte to form a galvanic cell with the doped structural film and metallic material acting as electrodes; and suppressing effects of the galvanic cell by including a nonionic detergent mixed in the release solution.

2. The method recited in claim 1 wherein the release solution comprises an acid.

3. The method recited in claim 2 wherein the acid is HF.

4. The method recited in claim 1 wherein the doped structural film comprises a doped semiconductor.

5. The method recited in claim 4 wherein the doped structural film comprises doped silicon.

6. The method recited in claim 5 wherein the doped structural film comprises doped polysilicon.

7. The method recited in claim 1 wherein the sacrificial material comprises an oxide.

8. The method recited in claim 7 wherein the oxide is a silicon oxide.

9. The method recited in claim 7 wherein the oxide comprises alumina.

10. The method recited in claim 1 wherein the sacrificial material comprises a nitride.

11. The method recited in claim 10 therein the nitride is a silicon nitride.

12. The method recited in claim 7 wherein the sacrificial material comprises photoresist.

13. The method recited in claim 1 wherein the metallic material comprises gold.

14. The method recited in claim 1 wherein the metallic material comprises aluminum.

15. The method recited in claim 1 wherein the metallic material comprises copper.

16. The method recited in claim 1 wherein the metallic material comprises platinum.

17. The method recited in claim 1 wherein the metallic material comprises nickel.

18. The method recited in claim 1 wherein the nonionic detergent comprises an alkyl group and a polyether-linked hydroxy group commonly linked to an aryl group.

19. The method recited in claim 1 wherein the nonionic detergent is included in the release solution with a concentration approximately between 0.01 and 0.1 vol. %.

20. The method recited in claim 1 wherein the nonionic detergent comprises a hydrophilic moiety and a hydrophobic moiety commonly linked to an aryl group.

21. The method recited in claim 1 wherein the microelectromechanical system is surface micromachined.

22. The method recited in claim 1 wherein the microelectromechanical system comprises part of a mirror array for use in a wavelength router.

23. A microelectromechanical system made according to the method recited in claim 1.

24. A method for preventing dopant leaching from a doped polysilicon structural film during fabrication of a surface micromachined mirror array having a plurality of moveable reflective surfaces for use in a wavelength router, the method comprising:

producing a mirror microstructure that includes the doped polysilicon, sacrificial silicon oxide material, and gold by a combination of techniques selected from the group consisting of deposition, patterning, and etching;

dissolving the silicon oxide material with a release solution, the release solution comprising HF and acting as an electrolyte forming a galvanic cell with the doped polysilicon structural film and gold acting as electrodes; and suppressing effects of the galvanic cell by including a nonionic detergent mixed in the release solution.

25. The method recited in claim 24 wherein the nonionic detergent comprises an alkyl group and a polyether-linked hydroxy group commonly linked to an aryl group.

26. The method recited in claim 24 wherein the nonionic detergent comprises a hydrophilic moiety and a hydrophobic moiety commonly linked to an aryl group.

27. A surface micromachined mirror array made according to the method recited in claim 24.

28. A method for fabricating a routing mechanism for use in a wavelength router of the type configured to receive, at an input port, light having a plurality of spectral bands and to direct subsets of the spectral bands to respective ones of a plurality of output ports by providing optical paths in a free-space optical train disposed between the input ports and the output ports and by providing the routing mechanism to direct a given spectral band to different output ports depending on a state of a dynamically configurable routing unit in the routing mechanism, the method comprising:

forming a plurality of such dynamically configurable routing units on a doped structural film with sacrificial material and metallic material by a combination of techniques selected from the group consisting of deposition, patterning, and etching;

dissolving the sacrificial material with a release solution, the release solution comprising a substance destructive to the sacrificial material and acting as an electrolyte forming a galvanic cell with the doped structural film and metallic material acting as electrodes; and suppressing the effects of the galvanic cell by including a nonionic detergent mixed in the release solution, whereby dopant leaching from the doped structural film due to the effects of the galvanic cell is suppressed.

29. The method recited in claim 28 wherein the nonionic detergent comprises an alkyl group and a polyether-linked hydroxy group commonly linked to an aryl group.

30. The method recited in claim 28 wherein the nonionic detergent comprises a hydrophilic moiety and a hydrophobic moiety commonly linked to an aryl group.

31. The method recited in claim 28 wherein the release solution comprises HF, the doped structural film comprises doped polysilicon, the sacrificial material comprises a silicon oxide, and the metallic material comprises gold.

32. A routing mechanism made according to the method recited in claim 31.

33. A routing mechanism made according to the method recited in claim 28.

34. A wavelength router comprising a routing mechanism made according to the method recited in claim 28.

* * * * *